(12) United States Patent
    Xie (10) Patent No.: US 11,329,106 B2
(45) Date of Patent: May 10, 2022

(54) ORGANIC LIGHT EMITTING DIODE (OLED) DISPLAY PANEL AND DISPLAY DEVICE

(71) Applicant: Wuhan China Star Optoelectronics Semiconductor Display Technology Co., Ltd., Wuhan (CN)

(72) Inventor: Ming Xie, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 228 days.

(21) Appl. No.: 16/632,549

(22) PCT Filed: Nov. 14, 2019

(86) PCT No.: PCT/CN2019/118602
    § 371 (c)(1),
    (2) Date: Jan. 21, 2020

(87) PCT Pub. No.: WO2021/027161
    PCT Pub. Date: Feb. 18, 2021

(65) Prior Publication Data
    US 2021/0359020 A1    Nov. 18, 2021

(30) Foreign Application Priority Data

Aug. 9, 2019   (CN) .......................... 201910733343.1

(51) Int. Cl.
    *H01L 27/32*    (2006.01)
    *G06F 3/044*    (2006.01)
    *H01L 51/00*    (2006.01)
    *H01L 51/52*    (2006.01)

(52) U.S. Cl.
    CPC .......... *H01L 27/323* (2013.01); *G06F 3/0443* (2019.05); *H01L 27/3244* (2013.01); *H01L 51/0097* (2013.01); *H01L 51/5253* (2013.01); *G06F 2203/04102* (2013.01); *H01L 2251/5338* (2013.01)

(58) Field of Classification Search
    CPC ............... H01L 27/323; H01L 27/3244; H01L 51/0097; H01L 51/5253; G06F 3/0443
    USPC ............................... 345/174; 349/12; 257/40
    See application file for complete search history.

(56) References Cited

U.S. PATENT DOCUMENTS

| 2014/0022468 | A1 | 1/2014 | Lai et al. | |
| 2015/0109542 | A1* | 4/2015 | Wu | G06F 3/041 |
| | | | | 349/12 |
| 2015/0115229 | A1* | 4/2015 | Jung | H01L 51/524 |
| | | | | 257/40 |
| 2018/0284505 | A1 | 10/2018 | Ye | |

(Continued)

FOREIGN PATENT DOCUMENTS

| CN | 101635276 | 1/2010 |
| CN | 103474433 | 12/2013 |

(Continued)

*Primary Examiner* — Prabodh M Dharia (57) ABSTRACT

The present application provides an OLED display panel and a display device, the OLED display panel includes: a flexible substrate; a touch functional layer formed on the flexible substrate; a driving circuit layer formed on the touch functional layer; a light emitting functional layer formed on the driving circuit layer; and an encapsulation layer formed on the light emitting functional layer.

12 Claims, 3 Drawing Sheets

(56) References Cited

U.S. PATENT DOCUMENTS

| | | | | |
|---|---|---|---|---|
| 2018/0342568 A1* | 11/2018 | Jin | ................... | H01L 27/3262 |
| 2019/0064987 A1* | 2/2019 | Lu | ................... | G06F 3/04164 |
| 2019/0243493 A1* | 8/2019 | Ding | ................... | G06F 3/0412 |
| 2020/0201483 A1 | 6/2020 | Feng | | |
| 2021/0064168 A1* | 3/2021 | Gong | ................ | H01L 27/3244 |

FOREIGN PATENT DOCUMENTS

| | | |
|---|---|---|
| CN | 104076966 | 10/2014 |
| CN | 106843621 | 6/2017 |
| CN | 108490666 | 9/2018 |
| CN | 109407893 | 3/2019 |
| CN | 110096174 | 8/2019 |

\* cited by examiner

ORGANIC LIGHT EMITTING DIODE (OLED) DISPLAY PANEL AND DISPLAY DEVICE

RELATED APPLICATIONS

This application is a National Phase of PCT Patent Application No. PCT/CN2019/118602 having International filing date of Nov. 14, 2019, which claims the benefit of priority of Chinese Patent Application No. 201910733343.1 filed on Aug. 9, 2019. The contents of the above applications are all incorporated by reference as if fully set forth herein in their entirety.

FIELD AND BACKGROUND OF THE INVENTION

The present application relates to the display technology field, and particularly to an organic light emitting diode (OLED) display panel and a display device.

In recent years, with the rapid development of display technology, OLED flexible displays have attracted great attention, and flexible panels with foldable features have become a trend of follow-up smartphones. Reducing an overall thickness of products and increasing anti-bending performance of the products are considered to improve the bending performance of the mobile phones. In order to achieve higher flexural strength of the products, in addition to changes in materials and process techniques, structures also need to be adjusted.

Due to low-temperature process characteristics of OLED organic light emitting materials, many key processes do not perform well at low temperatures, such as at a touch functional layer and at a encapsulation layer, moisture and oxidation resistance is much poorer when adopting manufacturing at low temperatures than when adopting manufacturing at high-temperatures. Moreover, touch performance of the touch functional layer will also be affected.

Therefore, the problem of poor touch performance of the existing OLED display panel needs to be improved.

SUMMARY OF THE INVENTION

The present application provides a OLED display panel and a display device to solve a problem of a poor touch performance of the existing OLED display panel.

In order to solve the above problem, the technical solution provided by the present application is as follows:

The present application provides an organic light emitting diode (OLED) display panel, comprising:
a flexible substrate;
a touch functional layer formed on the flexible substrate;
a driving circuit layer formed on the touch functional layer;
a light emitting functional layer formed on the driving circuit layer; and
an encapsulation layer formed on the light emitting functional layer.

In the OLED display panel of the present application, the touch functional layer comprises:
a touch electrode layer, wherein the touch electrode layer is patterned to form a plurality of self-capacitive touch electrodes in an array arrangement.

In the OLED display panel of the present application, the touch functional layer comprises:
a touch electrode layer, wherein the touch electrode layer is patterned to form a plurality of driving electrodes and a plurality of sensing electrodes in an array arrangement;
at least one signal bridge layer, wherein the at least one signal bridge layer is patterned to form a plurality of signal bridge leads, and the signal bridge leads are configured to bridge the driving electrodes and the sensing electrodes; and
an insulating layer located between the touch electrode layer and the at least one signal bridge layer.

In the OLED display panel of the present application, the at least one signal bridge layer is formed by at least one conducting layer of the driving circuit layer.

In the OLED display panel of the present application, the at least one signal bridge layer is formed by at least one shading layer of the driving circuit layer.

In the OLED display panel of the present application, the at least one signal bridge layer is formed by at least one second metal layer of the driving circuit layer.

In the OLED display panel of the present application, the touch functional layer comprises:
a driving electrode layer, wherein the driving electrode layer is patterned to form a plurality of driving electrodes in an array arrangement;
a sensing electrode layer, wherein the sensing electrode layer is patterned to form a plurality of sensing electrodes in an array arrangement; and
an insulating layer located between the driving electrode layer and the sensing electrode layer.

In the OLED display panel of the present application, a material of touch electrodes of the touch functional layer is transparent conductive material.

In the OLED display panel of the present application, a material of touch electrodes of the touch functional layer is metal, and the touch electrodes have holes located in light exiting areas.

In the OLED display panel of the present application, the touch electrodes form a grid.

The present application provides a display device, wherein the display device comprises an organic light emitting diode (OLED) display panel, the OLED display panel comprises:
a flexible substrate;
a touch functional layer formed on the flexible substrate;
a driving circuit layer formed on the touch functional layer;
a light emitting functional layer formed on the driving circuit layer; and
an encapsulation layer formed on the light emitting functional layer.

In the display device of the present application, the touch functional layer comprises:
a touch electrode layer, wherein the touch electrode layer is patterned to form a plurality of self-capacitive touch electrodes in an array arrangement.

In the display device of the present application, the touch functional layer comprises:
a touch electrode layer, wherein the touch electrode layer is patterned to form a plurality of driving electrodes and a plurality of sensing electrodes in an array arrangement;
at least one signal bridge layer, wherein the at least one signal bridge layer is patterned to form a plurality of signal bridge leads, and the signal bridge leads are configured to bridge the driving electrodes and the sensing electrodes; and
an insulating layer located between the touch electrode layer and the at least one signal bridge layer.

In the display device of the present application, the at least one signal bridge layer is formed by at least one conducting layer of the driving circuit layer.

In the display device of the present application, the at least one signal bridge layer is formed by at least one shading layer of the driving circuit layer.

In the display device of the present application, the at least one signal bridge layer is formed by at least one second metal layer of the driving circuit layer.

In the display device of the present application, the touch functional layer comprises:

a driving electrode layer, wherein the driving electrode layer is patterned to form a plurality of driving electrodes in an array arrangement;

a sensing electrode layer, wherein the sensing electrode layer is patterned to form a plurality of sensing electrodes in an array arrangement; and an insulating layer located between the driving electrode layer and the sensing electrode layer.

In the display device of the present application, a material of touch electrodes of the touch functional layer is transparent conductive material.

In the display device of the present application, a material of touch electrodes of the touch functional layer is metal, the touch electrodes have holes located in light exiting areas.

In the display device of the present application, the touch electrodes form a grid.

The benefit is: the present application provides an OLED display panel and a display device. The OLED display panel includes a flexible substrate, a touch functional layer formed on the flexible substrate, a driving circuit layer formed on the touch functional layer, a light emitting functional layer formed on the driving circuit layer, and an encapsulation layer formed on the light emitting functional layer. The touch functional layer adopts self-capacitive touch electrodes or inter-capacitor touch electrodes, and uses transparent electrodes or defining holes to improve transparency. In the present application, the touch functional layer is formed under the driving circuit layer and the light emitting functional layer, and the touch functional layer can be manufactured under a high-temperature process, thereby preventing the organic light emitting material of the light emitting functional layer from being affected by a low-temperature process and improving the touch control performance.

BRIEF DESCRIPTION OF THE SEVERAL VIEWS OF THE DRAWINGS

In order to more clearly illustrate the embodiments or the technical solutions in the prior art, the drawings to be used in the embodiments or the prior art description will be briefly described below. Obviously, the drawings in the following description are merely inventions. For some embodiments, other drawings may be obtained from those of ordinary skill in the art without departing from the drawings.

DESCRIPTION OF SPECIFIC EMBODIMENTS OF THE INVENTION

The following description of the various embodiments is provided to illustrate the specific embodiments of the invention. Directional terms mentioned in the present invention, such as "upper", "lower", "previous", "post", "left", "right", "inside", "outside", "side", etc., are merely references to the direction of the appended drawings. Therefore, the directional terminology used is for the purpose of illustration and understanding of the invention. In the figures, structurally similar elements are denoted by the same reference numerals.

The present application is directed to a problem of a poor touch performance, and the present embodiment can solve this defect.

Figure 1:
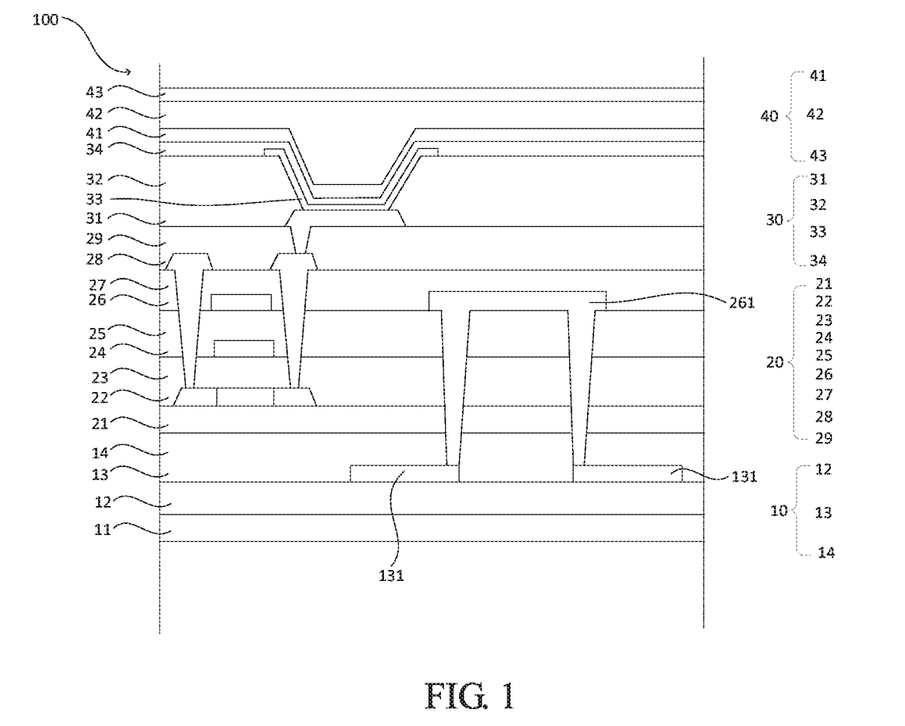
FIG. 1 is a first film layer structural schematic diagram of a touch functional layer of one embodiment according to the present application.

In one embodiment, referring to FIG. 1, the OLED display panel 100 of the embodiment includes:

a flexible substrate 11;

a touch functional layer 10 formed on the flexible substrate 11;

a driving circuit layer 20 formed on the touch functional layer 10;

a light emitting functional layer 30 formed on the driving circuit layer 20; and an encapsulation layer 40 formed on the light emitting functional layer 30.

The present application provides an OLED display panel and a display device. The OLED display panel includes a flexible substrate, a touch functional layer formed on the flexible substrate, a driving circuit layer formed on the touch functional layer, a light emitting functional layer formed on the driving circuit layer, and an encapsulation layer formed on the light emitting functional layer. The touch functional layer adopts self-capacitive touch electrodes or inter-capacitor touch electrodes, and transparent electrodes or defining holes can be used to improve transparency. In the present application, the touch functional layer is formed under the driving circuit layer and the light emitting functional layer. The touch functional layer can be manufactured under a high-temperature process, thereby preventing the organic light emitting material of the light emitting functional layer from being affected by a low-temperature process and improving the touch control performance.

In one embodiment, the flexible substrate 11 is formed on a glass substrate, and a material of the flexible substrate can be flexible polymers such as polyimides In one embodiment, referring to FIG. 1, the touch functional layer 10 includes:

a barrier layer 12 formed on the flexible substrate 11;

a touch electrode layer 13, wherein the touch electrode layer is patterned to form a plurality of driving electrodes and a plurality of sensing electrodes in an array arrangement;

at least one signal bridge layer, wherein the signal bridge layer is patterned to form a plurality of signal bridge leads; and a protective layer 14, wherein the protective layer 14 is formed on the touch electrode layer 13.

In one embodiment, the driving electrodes and the sensing electrodes are formed in a same layer to form a plurality of inter-capacitor touch electrodes.

The inter-capacitor touch electrodes are lateral electrodes and longitudinal electrodes formed on a glass surface and made of conductive materials. Two sets of electrodes intersect to generate a capacitor, that is, the two sets of electrodes respectively form two electrodes of a capacitor. When a finger touches the capacitive screen, the coupling between the two electrodes is affected, thereby changing a capacitance between the two electrodes. When testing an inter-capacitance, the lateral electrodes sequentially emit excitation signals, and the longitudinal electrodes receive signals, this way, the capacitances of all intersections of the lateral and longitudinal electrodes can be obtained, that is, the capacitances of the two-dimensional plane of the entire touch screen. According to the capacitances of the two-dimensional of the touch screen, the coordinate of each touch point can be calculated.

In one embodiment, referring to FIG. 1, the driving circuit layer 20 includes:

a buffer layer 21 formed on the protective layer 14;

an active layer 22 formed on the buffer layer 21 and patterned to form doped regions and channel regions;

a first insulating layer 23 formed on the active layer 22 and the buffer layer 21;

a first metal layer 24 formed on the first insulating layer 23 and patterned to form storage capacitor first electrode plates;

a second insulating layer 25 formed on the first metal layer 24;

a second metal layer 26 formed on the second insulating layer 25 and patterned to form storage capacitor second electrode plates;

an interlayer insulating layer 27 formed on the second metal layer 26 and the second insulating layer 25 and patterned to define first through holes;

a source and drain electrode layer 28 formed on the interlayer insulating layer 27 and patterned to define source electrodes, drain electrodes, and source and drain electrode wirings; and a planarization layer 29 formed on the source and drain electrode layer 28 and the interlayer insulating layer 27 and patterned to define second through holes.

In one embodiment, the doped region can be made by patterning the first metal layer 24 to form the first electrode for barring the channel region, and doping two sides of the channel region.

In one embodiment, the source electrode and the drain electrode are connected to the doped region of the active layer 22 through the first through hole patterned by the interlayer insulating layer 27.

In one embodiment, the signal bridge layer is made from the second metal layer 26 of the driving circuit layer 20.

In one embodiment, the second metal layer 26 also can be patterned to form the signal bridge leads 261, and the signal bridge leads 261 are used to bridge the driving electrodes and the sensing electrodes.

In one embodiment, referring to FIG. 1, the signal bridge leads 261 are used to bridge the driving electrodes 131.

In one embodiment, the second insulating layer 25 is patterned to form third through holes, and the driving electrodes 131 are connected to the signal bridge leads 261 through the third through holes.

In one embodiment, a material of the touch electrodes is a transparent conductive material.

In one embodiment, the transparent conductive material can be one selected from metal oxides such as nano silver wire, graphene, and indium tin oxide.

In one embodiment, referring to FIG. 1, the light emitting functional layer 30 includes:

a pixel electrode layer 31 formed on the planarization layer 29 and patterned to form pixel electrodes;

a pixel defining layer 32 formed on the pixel electrode layer 31 and patterned to define holes, the holes are used for defining light emitting regions of the light emitting main bodies;

a light emitting layer 33 formed in the light emitting regions defined by the pixel defining layer 32; and a cathode layer 34 formed on the light emitting layer 33 and the pixel defining layer 32.

In one embodiment, the pixel electrodes are connected to the drain electrodes through the second through holes of the planarization layer 29.

In one embodiment, the light emitting functional layer 30 also includes a hole injecting layer and a hole transferring layer located between the pixel electrode layer 31 and the light emitting layer 33, and an electron injecting layer and an electron transferring layer located between the cathode layer 34 and the light emitting layer 33.

Figure 2:
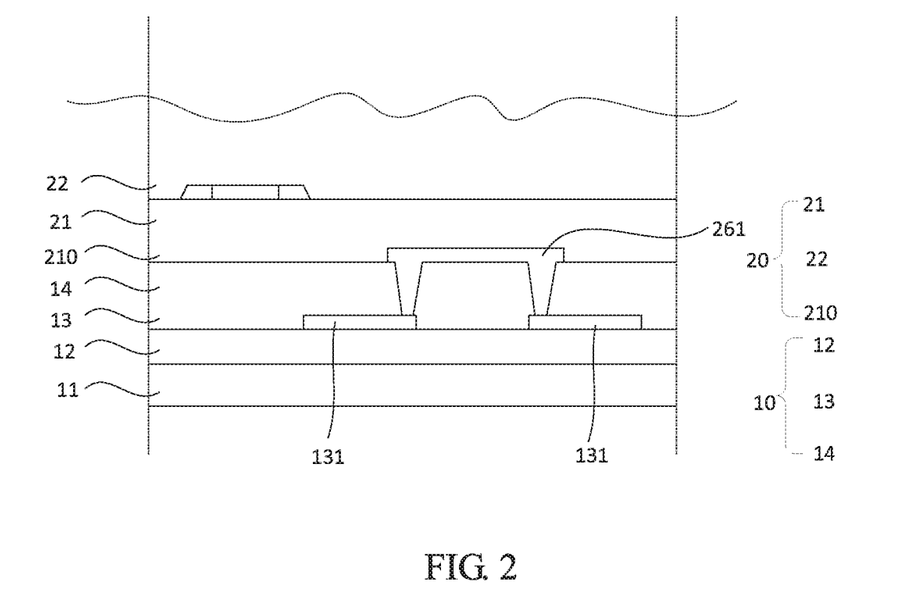
FIG. 2 is a second film layer structural schematic diagram of a touch functional layer of one embodiment according to the present application.

In one embodiment, referring to FIG. 2, the encapsulation layer 40 includes:

a first inorganic encapsulation layer 41 formed on the light emitting functional layer 30;

an organic encapsulation layer 42 formed on the first inorganic encapsulation layer 41; and a second inorganic encapsulation layer 43 formed on the organic encapsulation layer 42.

In one embodiment, the first inorganic encapsulation layer 41 and the second inorganic encapsulation layer 43 can be deposited on the light emitting functional layer 30 by chemical vapor deposition (CVD), physical vapor deposition (PVD), or atomic layer deposition (ALD).

In one embodiment, materials of the first inorganic encapsulation layer 41 and second inorganic encapsulation layer 43 can be one selected from silicon oxide, silicon nitride, and silicon oxynitride.

In one embodiment, the organic encapsulation layer 42 can be coated on the first inorganic encapsulation layer 41 by any one of an inkjet printing process, a spraying process, or a coating process.

In one embodiment, a material of the organic encapsulation layer 42 can be one selected from the group consisting of epoxy and acrylic.

In one embodiment, after manufacturing the encapsulation layer 40, the glass substrate located under the flexible substrate 11 can be peeled off by a laser peeling process.

In one embodiment, referring to FIG. 2, FIG. 2 is a second film layer structural schematic diagram of a touch functional layer of the OLED display panel. Compared with FIG. 1, FIG. 2 only shows the touch functional layer and a part of the driving circuit layer.

In one embodiment, the touch functional layer 10 includes:

a barrier layer 12 formed on the flexible substrate 11;

a touch electrode layer 13, wherein the touch electrode layer is patterned to form driving electrodes and sensing electrodes in an array arrangement;

at least one signal bridge layer, wherein the signal bridge layer is patterned to form a plurality of signal bridge leads; and a protective layer 14 formed on the touch electrode layer 13.

In one embodiment, the driving electrodes and the sensing electrodes are formed in a same layer to form inter-capacitor touch electrodes.

In one embodiment, the driving circuit layer 20 includes a shading layer 210 and an active layer 22 formed on the protective layer 14 and a buffer layer 21 located between the active layer 23 and the shading layer 210.

In one embodiment, a material of the shading layer 210 is metal.

In one embodiment, the active layer 22 is patterned to form doped regions and channel regions.

In one embodiment, the signal bridge layer is made from the shading layer 210 of the driving circuit layer 20.

In one embodiment, the shading layer 210 is patterned to form the signal bridge leads 261, and the signal bridge leads 261 are used to bridge the driving electrodes and the sensing electrodes.

In one embodiment, referring to FIG. 2, the signal bridge leads 261 are used to bridge the driving electrodes 131.

In one embodiment, the signal bridge leads 261 are connected to the driving electrode 131 through the through holes patterned in the protective layer 14.

In one embodiment, a material of the touch electrodes is a transparent conductive material.

Figure 3:
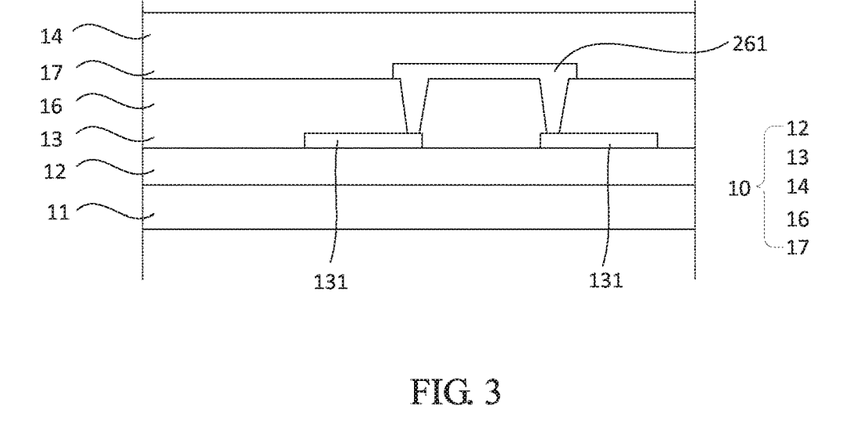
FIG. 3 is a third film layer structural schematic diagram of a touch functional layer of one embodiment according to the present application.

In one embodiment, referring to FIG. 3, FIG. 3 is a third film layer structural schematic diagram of a touch functional layer of the OLED display panel. Compared with FIG. 1, FIG. 3 only shows the touch functional layer.

In one embodiment, the touch functional layer 10 includes:

a barrier layer 12 formed on a flexible substrate 11;

a touch electrode layer 13 formed on the barrier layer 12, wherein the touch electrode layer 13 is patterned to form driving electrodes and sensing electrodes in an array arrangement;

at least one signal bridge layer 17, wherein the signal bridge layer 17 is patterned to form a plurality of signal bridge leads 261;

an insulating layer 16 located between the touch electrode layer 13 and the signal bridge layer 17; and a protective layer 14 formed on the signal bridge layer 17.

In one embodiment, the driving electrodes and the sensing electrodes are formed in a same layer to form inter-capacitor touch electrodes.

In one embodiment, the signal bridge leads 261 are used to bridge the driving electrodes and the sensing electrodes.

In one embodiment, referring to FIG. 3, the signal bridge leads 261 are used to bridge the driving electrodes 131.

In one embodiment, the insulating layer 16 is patterned to form through holes, and the through holes are used connected between the signal bridge leads 261 and the driving electrodes 131.

In one embodiment, a material of the insulating layer 16 can be one or a group selected from silicon oxide, silicon nitride, and silicon oxynitride.

In one embodiment, referring to FIG. 3, the signal bridge layer 17 is formed on the touch electrode layer 13 and the insulating layer 16.

In one embodiment, the touch electrode layer 13 is formed on the signal bridge layer 17 and the insulating layer 16.

In this embodiment, a material of the touch electrodes is a transparent conductive material.

Figure 4:
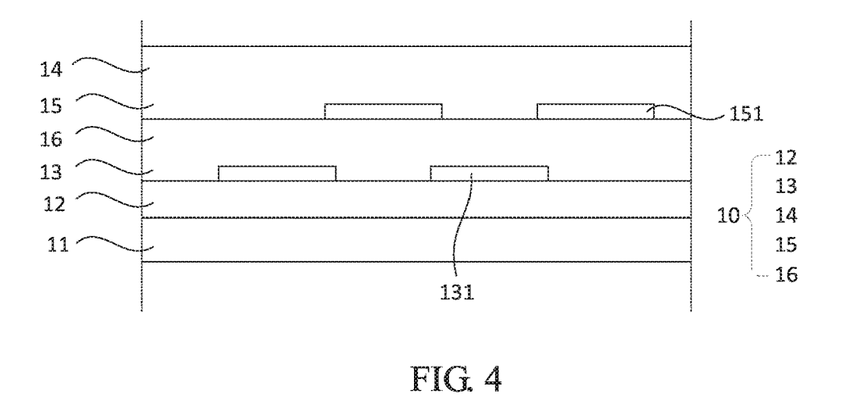
FIG. 4 is a fourth film layer structural schematic diagram of a touch functional layer of one embodiment according to the present application.

In one embodiment, referring to FIG. 4, FIG. 4 is a fourth film layer structural schematic diagram of a touch functional layer of the display panel. Compared with FIG. 1, FIG. 4 only shows the touch functional layer.

In one embodiment, the touch functional layer 10 includes:

a barrier layer 12 formed on the flexible substrate 11;

a touch electrode layer 13, wherein the touch electrode layer is patterned to form driving electrodes 131 in an array arrangement;

a sensing electrode layer 15, wherein the sensing electrode layer 15 is patterned to form sensing electrodes 151 in an array arrangement;

an insulating layer 16 located between the driving electrode 131 and the sensing electrode 151; and a protective layer 14 formed on the sensing electrode layer 15.

In one embodiment, the driving electrodes 131 and the sensing electrodes 151 are located at different layers to form the inter-capacitor touch electrodes.

In one embodiment, referring to FIG. 4, the sensing electrodes 151 are formed on the insulating layer 16 and the driving electrodes 131.

In one embodiment, the driving electrodes can be formed on the insulating layer and the sensing electrodes.

In one embodiment, a material of the insulating layer 16 can be selected one or a group from silicon oxide, silicon nitride, and silicon oxynitride.

In one embodiment, materials of the driving electrode 131 and the sensing electrode 151 are metal. Because metal material has optical opacity, the driving electrode 131 and the sensing electrode 151 of the present application have holes located in the light exiting area, referring to FIG. 5, such as the driving electrode 131, a hole 132 is defined in the driving electrode 131, and the hole 132 can make light pass through the light exiting area, thereby improving a light transmittance.

Figure 5:
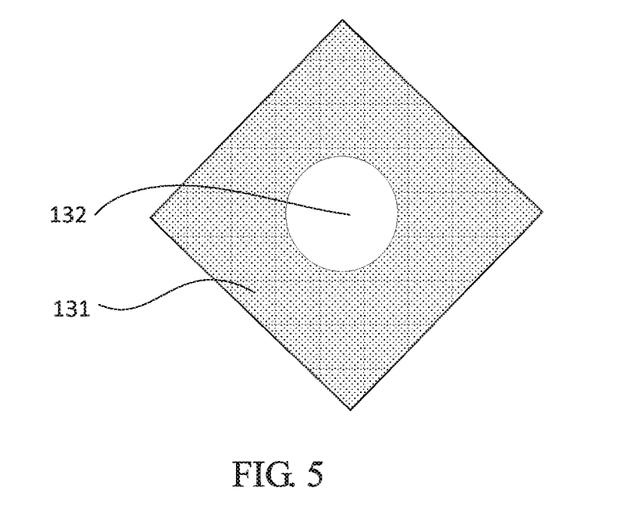
FIG. 5 is a first schematic diagram of a driving electrode of one embodiment according to the present application.

In one embodiment, a shape of the hole 132 can be one of a circle, a triangle, a square, a rectangle, or the like. Referring to FIG. 5, the shape of the hole 132 is a circle.

Figure 6:
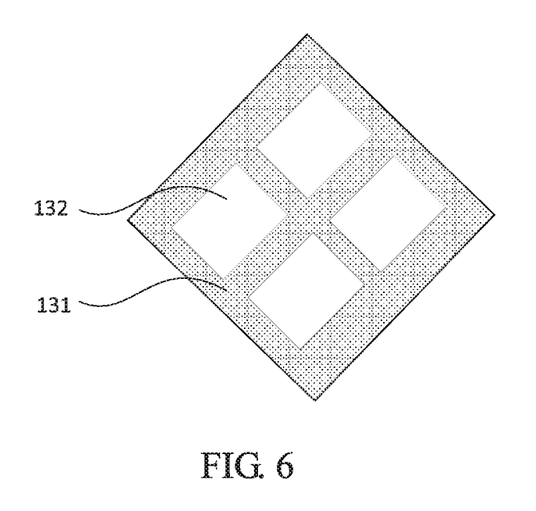
FIG. 6 is a second schematic diagram of a driving electrode of one embodiment according to the present application.

In one embodiment, the holes defined in the driving electrode 131 and the sensing electrode 151 located in the light exiting area form a grid, referring to FIG. 6, such as the driving electrode 131, each driving electrode 131 has four holes 132 defined thereof, a shape of each hole 132 is a rectangle, and the holes 132 combine together to form the grid, and the grid facilitates light passing through.

Figure 7:
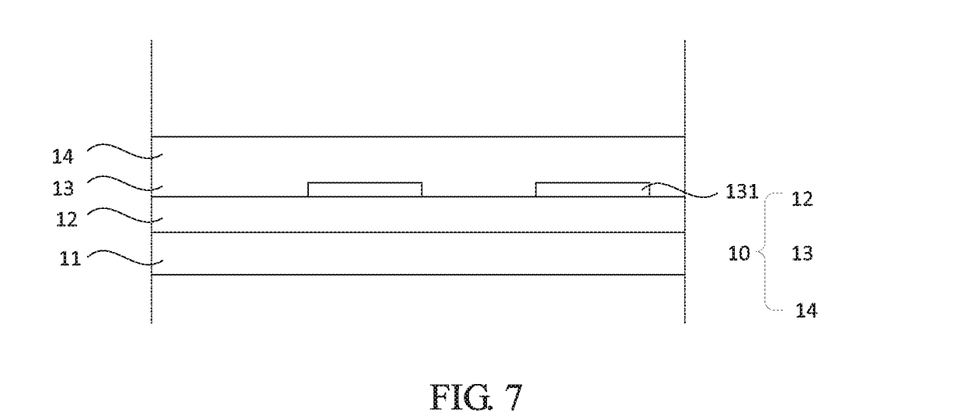
FIG. 7 is a fifth film layer structural schematic diagram of a touch functional layer of one embodiment according to the present application.

In one embodiment, referring to FIG. 7, FIG. 7 is a fifth film layer structural schematic diagram of a touch functional layer of the display panel. Compared with FIG. 1, FIG. 7 only show the touch functional layer.

In one embodiment, the touch functional layer 10 includes:

a barrier layer 12 formed on a flexible substrate 11;

a touch electrode layer 13, wherein the touch electrode layer is patterned to form self-capacitive touch electrodes 131 in an array arrangement; and a protective layer 14 formed on the touch electrode layer 13.

The self-capacitive touch electrodes are lateral electrodes and longitudinal electrodes formed on a glass surface and made of conductive materials, the lateral electrodes and longitudinal electrodes respectively generate capacitors with the ground. This capacitor is a so-called self-capacitor, that is, a capacitance is between the electrode and the ground. When a finger touches the capacitive screen, a capacitance of the finger will be added to the capacitance of the screen, thereby the capacitance of the screen will be increased. During touching and detecting, the inter-capacitor touch respectively detects the lateral electrodes array and the longitudinal electrodes array, and according to a difference of the capacitance between before detecting and after detecting, a lateral coordinate and a longitudinal coordinate are respectively determined, and a planar touch coordinate is generated. A scanning method of the self-capacitive touch electrodes is equivalent to projecting a touch point on the touch screen to a X-axis direction and a Y-axis direction respectively, coordinates of the X-axis direction and the Y-axis direction are calculated, and finally a coordinate of the touch point is combined and generated.

In one embodiment, a material of the touch electrodes is a transparent conductive material.

In one embodiment, the present application also provides a manufacturing method of an OLED display panel, which includes:

S1, providing a glass substrate, wherein a flexible substrate is formed on the glass substrate.

S2, forming a touch functional layer on the flexible substrate, wherein the touch functional layer includes a barrier layer, a touch electrode layer, an insulating layer, a signal bridge layer, and a protective layer formed successively. A manufacturing method of the touch functional layer is one of the above mentioned.

S3, forming a driving circuit layer on the touch functional layer, wherein the driving circuit layer includes a buffer layer, an active layer, a first insulating layer, a first metal layer, a second insulating layer, a second metal layer, an interlayer insulating layer, a source and drain electrode layer, and a planarization layer formed successively, wherein when metal wires are formed in the driving circuit layer by an avoidance design for avoiding the light exiting area and improving translucency.

S4, forming a light emitting functional layer on the driving circuit layer, wherein the light emitting functional layer includes a pixel electrode layer, a pixel defining layer, a light emitting layer, and a cathode layer formed successively.

S5, forming an encapsulation layer on the light emitting functional layer, the encapsulation layer includes a first inorganic encapsulation layer, an organic encapsulation layer, and a second inorganic encapsulation layer formed successively.

S6, peeling off the glass substrate.

At the same time, in one embodiment, the present application also provides a display device. The display device comprises an OLED display panel, the OLED display panel includes:

a flexible substrate;

a touch functional layer formed on the flexible substrate;

a driving circuit layer formed on the touch functional layer;

a light emitting functional layer formed on the driving circuit layer; and an encapsulation layer formed on the light emitting functional layer.

In one embodiment, the touch functional layer includes:

a touch electrode layer, wherein the touch electrode layer is patterned to form a plurality of self-capacitive touch electrodes in an array arrangement.

In one embodiment, the touch functional layer includes:

a touch electrode layer, wherein the touch electrode layer is patterned to form a plurality of driving electrodes and a plurality of sensing electrodes in an array arrangement;

at least one signal bridge layer, wherein the signal bridge layer is patterned to form a plurality of signal bridge leads, the signal bridge leads are configured to bridge the driving electrodes and the sensing electrodes; and an insulating layer located between the touch electrode layer and the signal bridge layer.

In one embodiment, the signal bridge layer is formed by at least one conducting layer of the driving circuit layer.

In one embodiment, the signal bridge layer is formed by at least one shading layer of the driving circuit layer.

In one embodiment, the signal bridge layer is formed by at least one second metal layer of the driving circuit layer.

In one embodiment, the touch functional layer includes:

a driving electrode layer, wherein the driving electrode layer is patterned to form a plurality of driving electrodes in an array arrangement a sensing electrode layer, wherein the sensing electrode layer is patterned to form a plurality of sensing electrodes in an array arrangement; and an insulating layer located between the driving electrode layer and the sensing electrode layer.

In one embodiment, a material of the touch electrodes of the touch functional layer is a transparent conductive material.

In one embodiment, a material of the touch electrodes of the touch functional layer is metal, and the touch electrodes have holes located in light exiting areas.

In one embodiment, the touch electrode forms a grid.

According to the above mentioned:

The present application provides an OLED display panel and a display device. The OLED display panel includes a flexible substrate, a touch functional layer formed on the flexible substrate, a driving circuit layer formed on the touch functional layer, a light emitting functional layer formed on the driving circuit layer, and an encapsulation layer formed on the light emitting functional layer. The touch functional layer adopts self-capacitive touch electrodes or inter-capacitor touch electrodes, and transparent electrodes or defining holes can be used to improve transparency. In the present application, the touch functional layer is formed under the driving circuit layer and the light emitting functional layer. The touch functional layer can be manufactured under a high-temperature process, thereby preventing the organic light emitting material of the light emitting functional layer from being affected by a low-temperature process and improving the touch control performance.

In the above, although the present application has been disclosed in the above preferred embodiments, the preferred embodiments are not intended to limit the application, and those skilled in the art can make various modifications without departing from the spirit and scope of the application. Therefore the scope of protection of this application is subject to the scope defined by the claims.

What is claimed is:

1. An organic light emitting diode (OLED) display panel, comprising:

a flexible substrate;

a touch functional layer formed on the flexible substrate;

a driving circuit layer formed on the touch functional layer;

a light emitting functional layer formed on the driving circuit layer; and an encapsulation layer formed on the light emitting functional layer, wherein the driving circuit layer comprises a storage capacitor, the storage capacitor comprises a first electrode plate and a second electrode plate, wherein the touch functional layer comprises: a plurality of driving electrodes, a plurality of sensing electrodes, and a plurality of signal bridge leads configured to bridge the driving electrodes or the sensing electrodes; and wherein the signal bridge leads and the second electrode plate are formed on a same layer.

2. The OLED display panel of claim 1, wherein the touch functional layer comprises:
a touch electrode layer, wherein the touch electrode layer is patterned to form the plurality of driving electrodes and the plurality of sensing electrodes in an array arrangement;
at least one signal bridge layer, wherein the at least one signal bridge layer is patterned to form the plurality of signal bridge leads; and
an insulating layer located between the touch electrode layer and the at least one signal bridge layer.

3. The OLED display panel of claim 1, wherein the touch functional layer comprises:
a driving electrode layer, wherein the driving electrode layer is patterned to form the plurality of driving electrodes in an array arrangement;
a sensing electrode layer, wherein the sensing electrode layer is patterned to form the plurality of sensing electrodes in an array arrangement; and
an insulating layer located between the driving electrode layer and the sensing electrode layer.

4. The OLED display panel of claim 1, wherein a material of touch electrodes of the touch functional layer is a transparent conductive material.

5. The OLED display panel of claim 1, wherein a material of touch electrodes of the touch functional layer is a metal, and the touch electrodes have holes located in light exiting areas.

6. The OLED display panel of claim 5, wherein the touch electrodes form a grid.

7. A display device, wherein the display device comprises an organic light emitting diode (OLED) display panel, the OLED display panel comprises:
a flexible substrate;
a touch functional layer formed on the flexible substrate;
a driving circuit layer formed on the touch functional layer;
a light emitting functional layer formed on the driving circuit layer; and
an encapsulation layer formed on the light emitting functional layer,
wherein the driving circuit layer comprises a storage capacitor, the storage capacitor comprises a first electrode plate and a second electrode plate,
wherein the touch functional layer comprises: a plurality of driving electrodes, a plurality of sensing electrodes, and a plurality of signal bridge leads configured to bridge the driving electrodes or the sensing electrodes; and
wherein the signal bridge leads and the second electrode plate are formed on a same layer.

8. The display device of claim 7, wherein the touch functional layer comprises:
a touch electrode layer, wherein the touch electrode layer is patterned to form the plurality of driving electrodes and the plurality of sensing electrodes in an array arrangement;
at least one signal bridge layer, wherein the at least one signal bridge layer is patterned to form the plurality of signal bridge leads; and
an insulating layer located between the touch electrode layer and the at least one signal bridge layer.

9. The display device of claim 7, wherein the touch functional layer comprises:
a driving electrode layer, wherein the driving electrode layer is patterned to form the plurality of driving electrodes in an array arrangement;
a sensing electrode layer, wherein the sensing electrode layer is patterned to form the plurality of sensing electrodes in an array arrangement; and
an insulating layer located between the driving electrode layer and the sensing electrode layer.

10. The display device of claim 7, wherein a material of touch electrodes of the touch functional layer is a transparent conductive material.

11. The display device of claim 7, wherein a material of touch electrodes of the touch functional layer is a metal, and the touch electrodes have holes located in light exiting areas.

12. The display device of claim 11, wherein the touch electrodes form a grid.

* * * * *